United States Patent [19]

Shinagawa et al.

[11] Patent Number: 5,652,449
[45] Date of Patent: Jul. 29, 1997

[54] SEMICONDUCTOR DEVICE WITH AN INSULATING FILM SEPARATING CONDUCTIVE LAYERS AND METHOD OF MAUFACTURING SEMICONDUCTOR DEVICE

[75] Inventors: Takeshi Shinagawa, Yokohama; Seiichi Mori, Ootaku, both of Japan

[73] Assignee: Kabushiki Kaisha Toshiba, Kawasaki, Japan

[21] Appl. No.: 617,251

[22] Filed: Nov. 23, 1990

Related U.S. Application Data

[63] Continuation of Ser. No. 308,029, Feb. 9, 1989, abandoned.

[30] Foreign Application Priority Data

Feb. 13, 1988 [JP] Japan ................... 63-30050

[51] Int. Cl.$^6$ ................................. H01L 29/788
[52] U.S. Cl. ................ 257/316; 257/323; 257/641
[58] Field of Search ................ 357/23.5, 34, 35, 357/49, 54; 257/316, 323, 641

[56] References Cited

U.S. PATENT DOCUMENTS

| | | | |
|---|---|---|---|
| 3,996,657 | 12/1976 | Simko et al. ............... | 29/571 |
| 4,169,270 | 9/1979 | Hayes ........................ | 357/54 |
| 4,203,158 | 5/1980 | Frohman-Bentchkowsky et al. | 357/23.5 |
| 4,271,582 | 6/1981 | Shirai et al. ............... | 357/52 |
| 4,426,764 | 1/1984 | Kosa et al. ................ | 357/23.5 |
| 4,638,342 | 1/1987 | Iyer .......................... | 357/54 |
| 4,714,951 | 12/1987 | Baudrant et al. .......... | 357/71 |
| 4,740,484 | 4/1988 | Horstroem et al. ........ | 357/71 |
| 4,982,250 | 1/1991 | Manor, II et al. ......... | 357/54 |

FOREIGN PATENT DOCUMENTS

| | | | |
|---|---|---|---|
| 187278 | 7/1986 | European Pat. Off. . | |
| 61-97866 | 5/1986 | Japan ...................... | 357/23.5 |
| 63-288047 | 11/1988 | Japan ...................... | 357/23.5 |

OTHER PUBLICATIONS

S. Mori, et al; "1984 Symposium on VLSI Technology". *Poly-Oxide / Nitride/Oxide Structure for Highly Reliable EPROM Cells* Sep., 1984, pp. 40–41.

*Primary Examiner*—J. Carroll
*Attorney, Agent, or Firm*—Foley & Lardner

[57] ABSTRACT

A semiconductor device comprises a lower conductive layer formed on a semiconductor substrate, a first insulation film layer formed at least on side faces of the lower conductive layer, a second insulation film layer formed around the lower conductive layer on which the first insulation film layer has been formed, a contact hole formed on the second insulation film layer in the vicinity of a side face of the lower conductive layer, and an upper conductive layer formed in the contact hole and over the second insulation film. The first insulation film layer is of a three-film structure comprising a first oxide film, a nitride film and a second oxide film.

15 Claims, 2 Drawing Sheets

SEMICONDUCTOR DEVICE WITH AN INSULATING FILM SEPARATING CONDUCTIVE LAYERS AND METHOD OF MAUFACTURING SEMICONDUCTOR DEVICE

This application is a continuation, of application Ser. No. 07/308,029, filed Feb. 9, 1989 abandoned.

BACKGROUND OF THE INVENTION

1. Field of the Invention

The present invention relates to a structure of semiconductor device which realizes a very fine gap to be formed between a contact hole in which an upper conductive layer is formed and a lower conductive layer, and to a method of manufacturing semiconductor devices having such a structure.

2. Description of the Prior Art

In some semiconductor devices, two conductive layers (wiring or electrode layers) which shall be insulated against each other are laminated one upon another with an insulation interlayer between them. A contact hole is formed on the insulation interlayer in the vicinity of the lower conductive layer, and a part of the upper conductive wiring or electrode layer is formed in the contact hole.

Integration of this sort of semiconductor may be improved by reducing a distance between the contact hole and the lower conductive layer.

If the distance between the contact hole and the lower conductive layer is reduced, however, the insulation interlayer between the contact hole and the lower conductive layer will be thinned. As a result, an insulation property, i.e., voltage resistance of the insulation interlayer may be deteriorated due to defects, etc., in the insulation interlayer. This may cause the lower conductive layer and the upper conductive layer in the contact hole to short-circuit.

To cope with this problem, a structure is proposed to form a contact hole firstly and then a nitride film ($Si_3N_4$) on an inner wall of the contact hole. After that, an upper conductive layer is formed on the nitride film in the contact hole. The nitride film of this structure can improve an insulation property between a lower conductive layer and the upper conductive layer formed in the contact hole.

However, the nitride film formed on the inner wall of the contact hole narrows an actual opening area of the contact hole. Therefore, to obtain the same opening area as that of a contact hole with no nitride film, the opening area of the contact hole of this structure shall be widened. As a result, the distance between the contact hole and the lower conductive layer may be reduced, but integration of the structure cannot be improved.

SUMMARY OF THE INVENTION

To solve the problem, an object of the present invention is to provide a semiconductor device structure which enables a distance between a lower conductive layer and a contact hole to be reduced to improve integration of the semiconductor device, and a method of manufacturing semiconductor devices having such a structure.

Another object of the present invention is to provide a semiconductor device structure which can remarkably reduce insulation failures to occur between upper and lower conductive layers as well as reducing a distance between the lower conductive layer and a contact hole, and a method of manufacturing semiconductor devices having such a structure.

According to an aspect of the present invention, a semiconductor device comprises a lower conductive layer formed on a semiconductor substrate, a first insulation film layer formed at least on side faces of the lower conductive layer, a second insulation film layer formed around the lower conductive layer on which the first insulation film layer has been formed, a contact hole formed on the second insulation film layer in the vicinity of a side face of the lower conductive layer, and an upper conductive layer formed in the contact hole and over the second insulation film.

According to another aspect of the present invention, a method of manufacturing a semiconductor device comprises a process of forming a lower conductive layer on a semiconductor substrate, a process of forming an insulation film layer including a nitride film at least on side faces of the lower conductive layer, a process of forming an insulation interlayer around the lower conductive layer on which the insulation film layer has been formed, a process of opening a contact hole on the insulation interlayer in the vicinity of the lower conductive layer, and a process of forming an upper insulation layer in the contact hole and over the insulation interlayer.

According to the semiconductor device and the manufacturing method of semiconductors of the present invention, the insulation film layer including the nitride film is formed at least on the side faces of the lower conductive layer (a wiring layer or an electrode layer), then the contact hole is opened in the vicinity of the lower wiring or electrode layer, thus reducing a distance between the contact hole and the lower wiring or electrode layer.

These and other objects, features and advantages of the present invention will be more apparent from the following detailed description of preferred embodiments in conjunction with the accompanying drawings.

DETAILED DESCRIPTION OF THE EMBODIMENTS

Figure 1A:
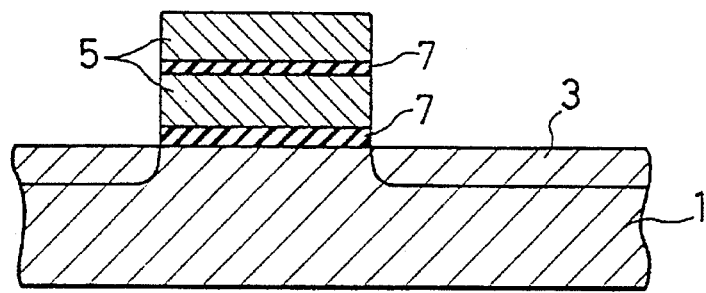
FIGS. 1a to 1d are views showing processes of a method of manufacturing a semiconductor device according to an embodiment of the present invention.

FIGS. 1a to 1d show processes of the method of manufacturing a semiconductor device according to the embodiment of the present invention. This embodiment relates to an EPROM (an ultraviolet ray erasable PROM).

Firstly, structure of the EPROM to be manufactured according to the method of the present invention will be explained with reference to FIG. 1d.

In the figure, $N^+$ diffusion layers 3 are formed just under the surface of a P-type silicon substrate 1. The diffusion layers 3 will be a source region and a drain region of a cell of the EPROM, respectively.

On the channel region of the silicon substrate 1, a gate electrode 5 of the cell is formed. The gate electrode 5 is a lower electrode layer (a lower conductive layer). The gate electrode 5 comprises two polysilicon layers. The two layers of the gate electrode 5 are covered with a first oxide film (an $SiO_2$ film) 7 which forms a gate insulating film which separates and insulate the electrode 5 from a peripheral region and from said substrate.

On the $SiO_2$ film 7, a nitride film (an $Si_3N_4$ film) 9 is formed to cover the surface of the $SiO_2$ film. On the $Si_3N_4$ film 9, a second oxide film (an SiO$_2$ film) 11 is formed to cover the surface of the Si$_3$N$_4$ 9. Namely, the gate electrode 5 is covered with a three-film insulation layer comprising the SiO$_2$ film 7, Si$_3$N$_4$ film 9 and SiO$_2$ film 11.

Around the three-film insulation layer, an insulation interlayer 13 is formed. The insulation interlayer 13 on one of the diffusion layers 3 is provided with a contact hole 15 which is opened adjacent to the gate electrode 5. In the contact hole 15, an aluminum (Al) wiring layer 17 is formed. The wiring layer 17 is an upper wiring layer (a conductive layer) for the one diffusion layer 3.

The respective films of the three-film insulation layer, i.e., the first oxide film 7, nitride film 9 and second oxide film 11 are, for example, 100 Å, 120 Å and 100 Å in thickness, respectively. The three-film insulation layer achieves a defective density of 0.01 cm$^{-2}$ or below, an electric field strength of 30 V or over irrespective of polarity, and a leak current of 10$^{-10}$ A/mm$^{-2}$ or below with respect to an applied voltage of 20 V.

Therefore, a thickness "d" of the portion 14 (FIG. 1d) of insulation interlayer 13 between the three-film insulation layer and the contact hole will be about 0.1 μm.

The aluminum wiring layer 17 is formed over the insulation interlayer 13, along the inner wall surface of the contact hole 15 and on the surface of the one diffusion layer 3. In this embodiment, the lower electrode layer is the two-layer gate electrode 5, and the upper wiring layer is the aluminum wiring layer 17.

An example of a process for manufacturing the semiconductor structure explained in the above will be described with reference to FIGS. 1a to 1d.

Firstly, the SiO$_2$ film 7 is formed on the silicon substrate 1. On the SiO$_2$ film 7, the first polysilicon layer is formed. On the first polysilicon layer, another SiO$_2$ layer 7 is formed and on which the second polysilicon layer is formed. By patterning these layers according to a photolithography technique, the two-layer gate electrode 5 is formed. Then, the N$^+$ type diffusion layers 3 are formed with an ion implantation technique, as shown in FIG. 1a.

Figure 1B:
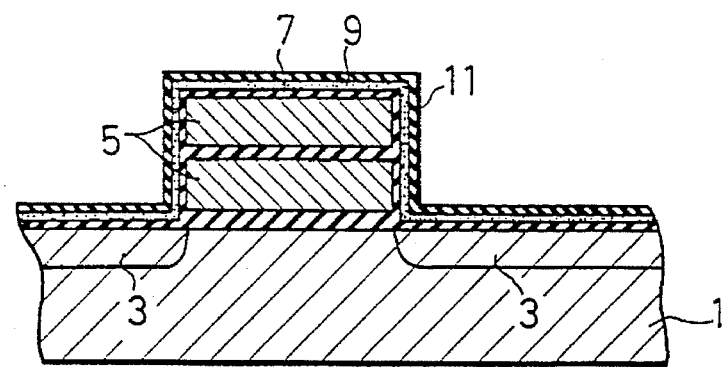
Figure 1C:
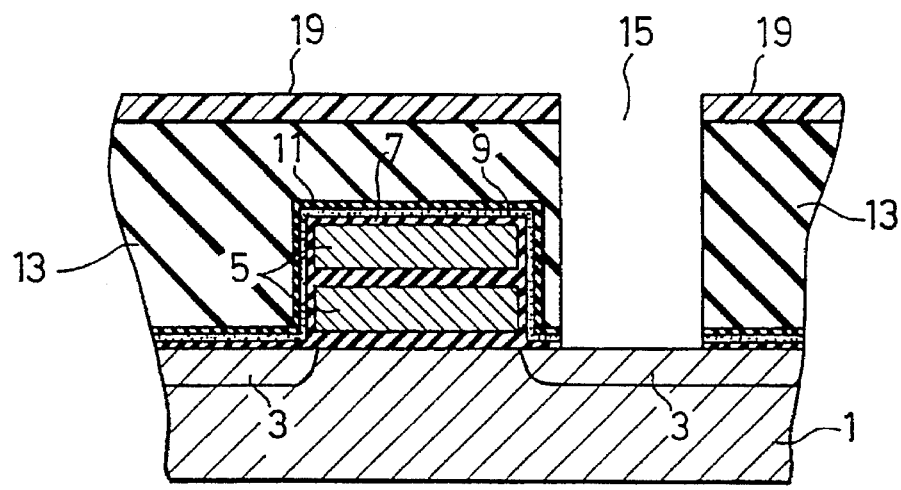

After that, the SiO$_2$ film 7, Si$_3$N$_4$ film 9 and SiO$_2$ film 11 are thinly deposited over the gate electrode 5 in the thickness of, for example, about 100 Å, 120 Å and 100 Å, respectively, as shown in FIG. 1b. Then, the insulation interlayer 13 is deposited on the SiO$_2$ film 11, and a resist material 19 is coated over the insulation interlayer 13. The resist material 19 is patterned according to the photolithography technique, and the contact hole 15 is opened on the diffusion layer 3 according to an RIE (Reactive Ion Etching) method as shown in FIG. 1c.

After that, the resist material 19 is removed, and aluminum is deposited on the surface of one of the diffusion layers 3, in the contact hole 15 and over the insulation interlayer 13. The aluminum will form the upper wiring layer with respect to the gate electrode 5 which is the lower electrode layer. The deposited aluminum is patterned to form the aluminum wiring layer 17. Thus, the EPROM cell provided with the two-layer electrode 5 is completed as shown in FIG. 1d.

As described in the above, the three-film insulation layer comprising the SiO$_2$ film 7, Si$_3$N$_4$ film 9 and SiO$_2$ film 11 is thinly formed, and then the contact hole 15 is opened and formed. Therefore, a distance between the gate electrode 5 and the contact hole 15 is short so that an opening area of the contact hole 15 may smaller than that of the conventional contact hole which has an insulation film. Accordingly, high integration is realized.

The present invention is not limited to the above-mentioned embodiment but various modifications may be possible.

Figure 1D:
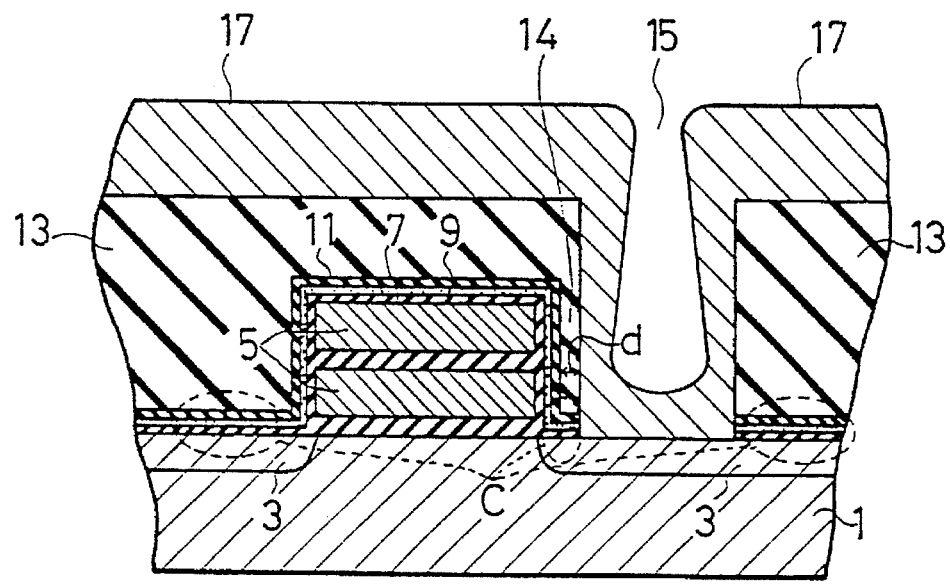
Figure 2:
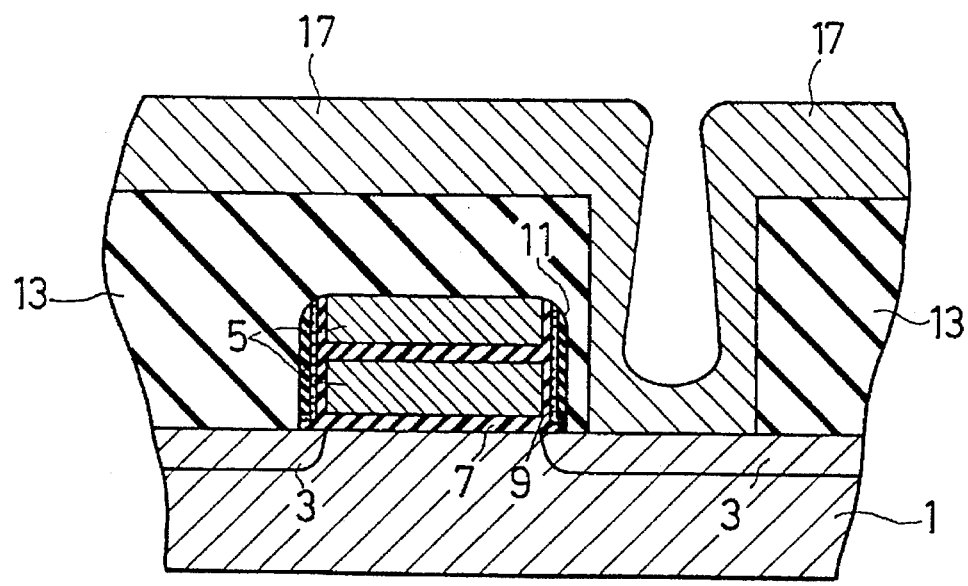
FIG. 2 is a view showing the structure of a semiconductor device according to another embodiment of the present invention.

For example, if the semiconductor element tends to catch charges in regions indicated with a reference mark "c" in FIG. 1d, the three-film insulation layer may firstly be formed as shown in FIG. 1b. Then, the three-film insulation layer formed on the gate electrode 5 and silicon substrate 1 is removed according to an etchback method to leave the three-film insulation layer only on side faces of the gate electrode 5 as shown in FIG. 2. With this structure, charges are hardly caught in the regions "c" while insulation properties of the upper aluminum wiring layer 17 and lower gate electrode 5 are maintained with no change.

Although the embodiment has used polysilicon for the lower electrode layer and aluminum for the upper wiring layer, the materials are not limited to them.

In summary, according to the present invention, thin insulation films including a nitride film are formed at least on side faces of a lower wiring or electrode layer, and then a contact hole is opened and formed adjacent to the lower wiring or electrode layer. As a result, insulation failures may rarely happen between the lower wiring or electrode layer and an upper wiring or electrode layer. In addition, a distance between the lower wiring or electrode layer and the contact hole is reduced to realize high integration.

Various modifications will become possible for those skilled in the art after receiving the teachings of the present disclosure without departing from the scope thereof.

What is claimed is:

1. A device structure of a transistor in an active region of a semiconductor substrate at a stage in processing, the active region being bounded by a field oxide in the substrate, comprising:

a first layer of polysilicon covering an intermediate portion of the active region leaving first and second uncovered portions of the active region on opposite sides of the first layer;

a first insulator layer between the first layer and the active region;

a second insulator layer over the first layer of polysilicon;

a second layer of polysilicon over and substantially coterminous with the first layer of polysilicon over the active region;

a layer of nitride over substantially all of the active region, said layer of nitride being not greater than about 200 Angstroms thick; and a third insulator layer over the layer of nitride and the semiconductor substrate outside the active region.

2. A semiconductor device comprising:

a. a substrate;

b. a lower conductive layer which comprises first and second conductive layers and which formed on a portion of said substrate;

c. a interlayer insulating film formed on said substrate over said lower conductive layer and having a contact hole adjacent said lower conductive layer in contact with said substrate;

d. an upper conductive layer formed on said interlayer insulating film and contacting said substrate through said contact hole; and e. insulating means, formed on a side of said lower conductive layer adjacent said contact hole, for isolating said lower conductive layer from said upper conductive layer, whereby high integration is achieved, wherein said insulating means comprises a triple-layered film comprising a first oxide layer laminated onto said lower conductive layer, a nitride layer laminated onto said first oxide layer, and a second oxide layer laminated onto said nitride layer.

3. The semiconductor device as claimed in claim 2, wherein the thickness of said interlayer insulating film between said insulating means on said lower conductive layer and said contact hole is 0.1 μm.

4. The device of claim 2, wherein said substrate is a silicon semiconductor substrate.

5. The device of claim 2, wherein said first and second oxide layers are formed of the same material.

6. The device of claim 2, wherein said second oxide layer is formed of $SiO_2$.

7. A semiconductor device comprising:

a. a substrate;

b. a lower conductive layer formed on a portion of said substrate;

c. a interlayer insulating film formed on said substrate over said lower conductive layer and having a contact hole adjacent said lower conductive layer contact with said substrate;

d. an upper conductive layer formed on said interlayer insulating film and contacting said substrate through said contact hole; and e. insulating means, formed on a side of said lower conductive layer adjacent said contact hole, for isolating said lower conductive layer from said upper conductive layer so as to reduce the necessary spacing between said lower conductive layer and said upper conductive layer, whereby high integration is achieved, wherein said insulating means comprises a triple-layered film comprising a first oxide layer laminated onto said lower conductive layer, a nitride layer laminated onto said first oxide layer, and a second oxide layer laminated onto said nitride layer, and wherein the thickness of said first oxide film is 100 Å, the thickness of the nitride film is 120 Å, and the thickness of the second oxide film is 100 Å.

8. A semiconductor device comprising:

a. a substrate;

b. a lower conductive layer formed on a portion of said substrate;

c. a interlayer insulating film formed on said substrate over said lower conductive layer and having a contact hole adjacent said lower conductive layer in contact with said substrate;

d. an upper conductive layer formed on said interlayer insulating film and contacting said substrate through said contact hole; and e. insulating means, formed on a side of said lower conductive layer adjacent said contact hole, for isolating said lower conductive layer from said upper conductive layer so as to reduce the necessary spacing between said lower conductive layer and said upper conductive layer, whereby high integration is achieved, wherein said insulating means comprises a triple-layered film comprising a first oxide layer laminated onto said lower conductive layer, a nitride layer laminated onto said first oxide layer, and a second oxide layer laminated onto said nitride layer;

wherein said lower conductive layer comprises a first conductive layer located above an upper surface of said substrate and a second conductive layer located above said first conductive layer, and wherein said insulating means is formed on the sides of both of said first and said second conductive layers.

9. The device of claim 8, further comprising an insulating film formed between said substrate and said first conductive layer and between said first and second conductive layers.

10. The device of claim 9, wherein said first and second conductive layers are composed of polysilicon and said insulating film is composed of an oxide film.

11. The device of claim 8, wherein said first and second oxide layers are formed of the same material.

12. The device of claim 8, wherein said second oxide layer is formed of $SiO_2$.

13. A semiconductor structure for a PROM comprising:

a semiconductor substrate within which a source region, a channel region and a drain region are formed;

a gate insulating film formed on said channel region;

a first gate electrode formed on said gate insulating film;

a second gate electrode formed on and insulated from said first gate electrode through an insulating film;

an interconnecting conductive layer formed on and insulated from said first gate electrode with an insulating interlayer therebetween and contacting one of said source and drain regions through a contact hole opened in said interlayer and located just adjacent to said first and second gate electrodes; and a triple-layered insulating film interposed between said interconnecting conductive layer located in said contact hole and both of said first and second electrodes and consisting of a first oxide layer, a nitride layer and a second oxide layer laminated in this order.

14. The structure of claim 13, wherein said first and second oxide layers are formed of the same material.

15. The structure of claim 13, wherein said second oxide layer is formed of $SiO_2$.

* * * * *